United States Patent
Nakamura et al.

(10) Patent No.: US 9,893,161 B2
(45) Date of Patent: Feb. 13, 2018

(54) PARASITIC CAPACITANCE REDUCTION STRUCTURE FOR NANOWIRE TRANSISTORS AND METHOD OF MANUFACTURING

(71) Applicant: Tokyo Electron Limited, Minato-ku, Tokyo (JP)

(72) Inventors: Genji Nakamura, Tokyo (JP); Kandabara N. Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 6 days.

(21) Appl. No.: 15/136,588

(22) Filed: Apr. 22, 2016

(65) Prior Publication Data
US 2016/0315167 A1    Oct. 27, 2016

Related U.S. Application Data

(60) Provisional application No. 62/151,110, filed on Apr. 22, 2015.

(51) Int. Cl.
*H01L 29/51* (2006.01)
*H01L 21/311* (2006.01)
*H01L 29/06* (2006.01)
*H01L 29/423* (2006.01)
*H01L 29/786* (2006.01)

(52) U.S. Cl.
CPC ...... *H01L 29/517* (2013.01); *H01L 21/31116* (2013.01); *H01L 29/0673* (2013.01); *H01L 29/42392* (2013.01); *H01L 29/78654* (2013.01); *H01L 29/78684* (2013.01); *H01L 29/78696* (2013.01)

(58) Field of Classification Search
CPC .................................................. H01L 29/517
See application file for complete search history.

(56) References Cited

U.S. PATENT DOCUMENTS

| 8,753,942 B2 | 6/2014 | Kuhn et al. |
| 8,778,768 B1 * | 7/2014 | Chang ............... H01L 29/42392 257/213 |

FOREIGN PATENT DOCUMENTS

| WO | 2014142856 A1 | 9/2014 |
| WO | 2014142950 A1 | 9/2014 |
| WO | 2014142952 A1 | 9/2014 |

* cited by examiner

*Primary Examiner* — Fernando L Toledo
*Assistant Examiner* — Valerie N Newton (57) ABSTRACT

Embodiments of the invention describe parasitic capacitance reduction structure for nanowire transistors and method of manufacturing. According to one embodiment the method includes providing a substrate, forming a first nanowire on the substrate, forming a second nanowire on the first nanowire, forming a first dielectric layer between the substrate and the first nanowire, and forming a second dielectric layer between first dielectric layer and the second nanowire, where the second dielectric layer has a higher dielectric constant than the first dielectric layer. According to one embodiment, a nanowire transistor includes a first nanowire on a substrate, a second nanowire on the second nanowire, a first dielectric layer between the substrate and the first nanowire, and a second dielectric layer between the first dielectric layer and the second nanowire, where the second dielectric layer has a higher dielectric constant than the first dielectric layer.

20 Claims, 11 Drawing Sheets

PARASITIC CAPACITANCE REDUCTION STRUCTURE FOR NANOWIRE TRANSISTORS AND METHOD OF MANUFACTURING

CROSS-REFERENCE TO RELATED APPLICATIONS

This application is related to and claims priority to U.S. Provisional Patent Application Ser. No. 62/151,110 filed on Apr. 22, 2015, the entire contents of which are herein incorporated by reference.

FIELD OF INVENTION

The present invention relates to the field of semiconductor manufacturing and semiconductor devices, and more particularly to a parasitic capacitance reduction structure for nanowire transistors and method of manufacturing.

BACKGROUND OF THE INVENTION

The semiconductor industry has relied on scaling/reducing device feature size in order to boost performance and increase transistor density. The continued device performance improvement due to scaling has seen the introduction of unique technologies such as semiconductor on insulator (e.g., silicon on insulator (SOI) and germanium on insulator (GeOI), stressor such SiGe, SiC to improve mobility at the 90 nm node, epitaxial regrowth of source and drain (raised source and drain), high-k metal gate (HKMG) at the 45 nm node, and 3D structures such as FinFETs and trigates at the 22 nm node.

However, maintaining the device performance and good short channel control is quite challenging beyond the 14 nm technology node. New materials (e.g., III-V semiconductors, Ge, SiGe, graphene, $MoS_2$, $WS_2$, $MoSe_2$, and $WS_2$) and new integration schemes (e.g., nanowires) are needed. Nanowire transistors offer scaling of feature sizes, good short channel control, and enhancement in the device mobility, hence enhancement in device speed.

This disclosure describes nanowires fabrication and integration, and in particular a method and device for parasitic capacitance reduction for nanowire transistors.

SUMMARY OF THE INVENTION

According to one embodiment, a method is provided for forming a nanowire transistor. The method includes providing a substrate, forming a first nanowire on the substrate, forming a second nanowire on the first nanowire, forming a first dielectric layer between the substrate and the first nanowire, and forming a second dielectric layer between first dielectric layer and the first nanowire, where the second dielectric layer has a higher dielectric constant than the first dielectric layer.

According to one embodiment, a nanowire transistor is provided. The nanowire transistor includes a first nanowire on a substrate, a second nanowire on the first nanowire, a first dielectric layer between the substrate and the first nanowire, and a second dielectric layer between first dielectric layer and the first nanowire, where the second dielectric layer has a higher dielectric constant than the first dielectric layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1:
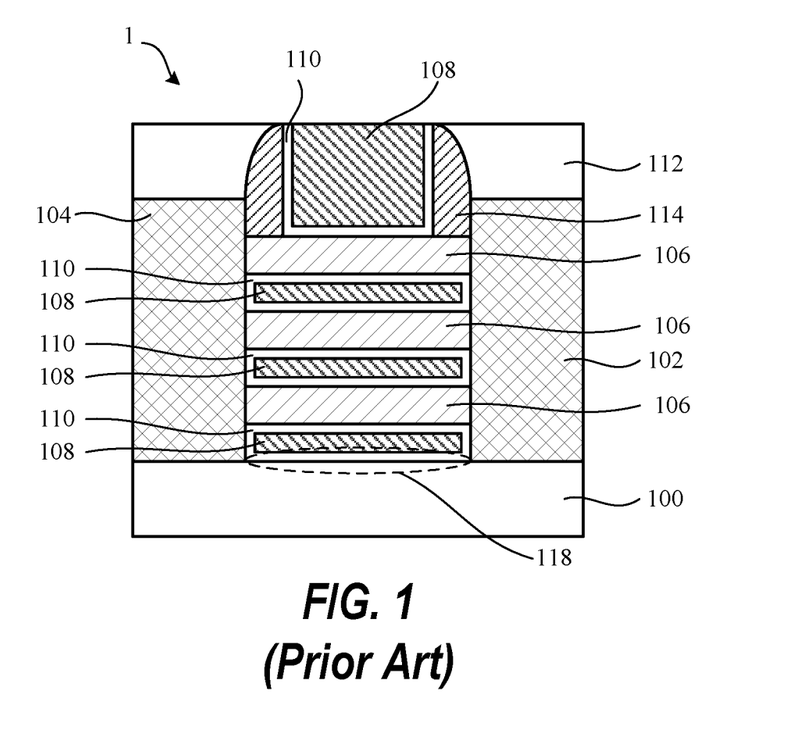
FIG. 1 schematically shows a cross-sectional view of a prior art nanowire transistor formed on a substrate.

FIG. 1 schematically shows a cross-sectional view of a prior art nanowire transistor 1 formed on a substrate. The nanowire transistor 1 may be formed using conventional semiconductor manufacturing methods. The nanowire transistor 1 is formed on a substrate 100 and contains source/drains regions 102/104, hard mask 112, sidewall spacer 114, nanowires 106, high-k layer 110, and metal gate layer 108. The nanowires 106 may, for example, consist of epitaxial Si or epitaxial SiGe materials.

FIG. 1 further shows a nanowire transistor region 118 that the inventors have identified as having high parasitic capacitance and high current leakage ($T_{off}$) when the nanowire transistor 1 is in the OFF state. The nanowire transistor region 118 includes the substrate 100, the high-k layer 110, and the metal gate layer 108. Embodiments of the invention provide a method for reducing the parasitic capacitance and Ioff in the nanowire transistor region 118.

Figure 2A:
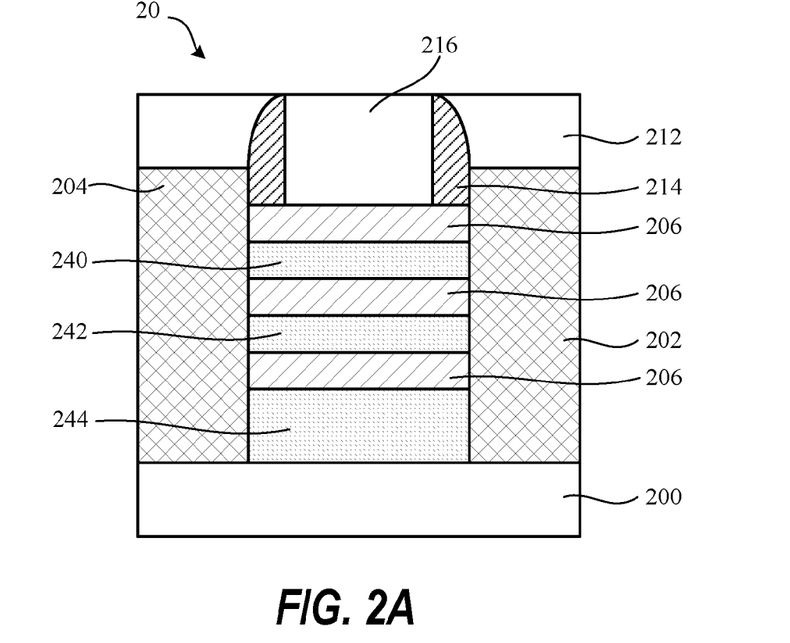
FIGS. 2A-2H schematically show through cross-sectional views formation of a nanowire transistor according to an embodiment of the invention.

FIGS. 2A-2H schematically show through cross-sectional views formation of a nanowire transistor according to an embodiment of the invention. FIG. 2A schematically shows a cross-sectional view of a nanowire transistor 20 formed on a substrate 200, where the nanowire transistor 20 contains source/drains regions 202/204, hard mask 212, sidewall spacer 214, nanowires 206, epitaxial layers 240, 242, 244, and dummy gate 216. Only three nanowires 206 are shown in the nanowire transistor 20, but embodiments of the invention can include any number of nanowires. The nanowires 206 may, for example, consist of epitaxial Si or epitaxial SiGe materials. The nanowire transistor 20 may, for example, be formed by creating a fin transistor containing the nanowires 206 and the epitaxial layers 240, 242, 244. According to an embodiment of the invention, the epitaxial layer 244 may be thicker than the epitaxial layers 240 and 242.

Figure 2B:
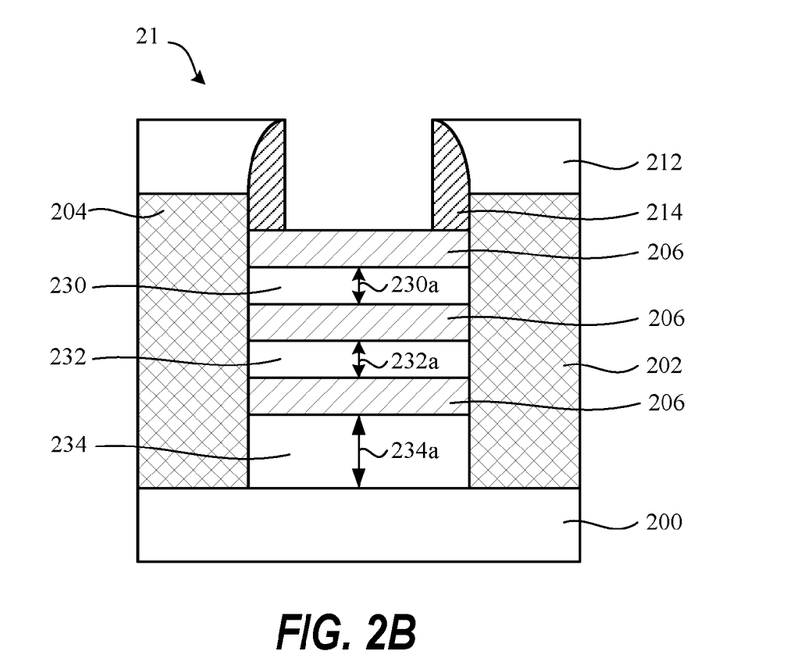

FIG. 2B schematically shows a cross-sectional view of a nanowire transistor 21 following a selective isotropic etch process that removes dummy gate 216 and the epitaxial layers 240, 242, 244. The selective isotropic etch process forms openings 230, 232, 234 having heights of 230a, 232a, 234a, respectively. According to an embodiment of the invention, the height 234a of the first opening 234 may be greater than the height 230a of the second opening 230 and the height 232a of the third opening 232.

Figure 2C:
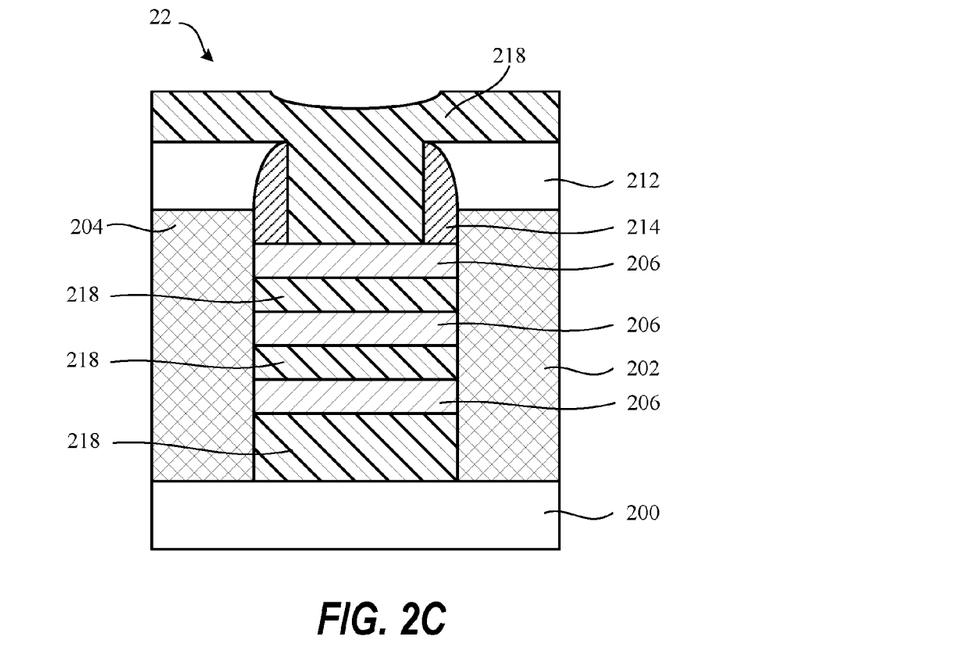

FIG. 2C schematically shows a cross-sectional view of a nanowire transistor 22 following deposition of a first dielectric layer 218 that fills the openings 234, 232 and 230 in the nanowire transistor 22. According to one embodiment, complete filling of the openings 234, 232 and 230 in the nanowire transistor 22 is not required. The first dielectric layer 218 can, for example, be selected from $SiO_2$, SiON, and SiN. According to one embodiment, the first dielectric layer 218 can have a dielectric constant less than 10, or less than 8.

Figure 2D:
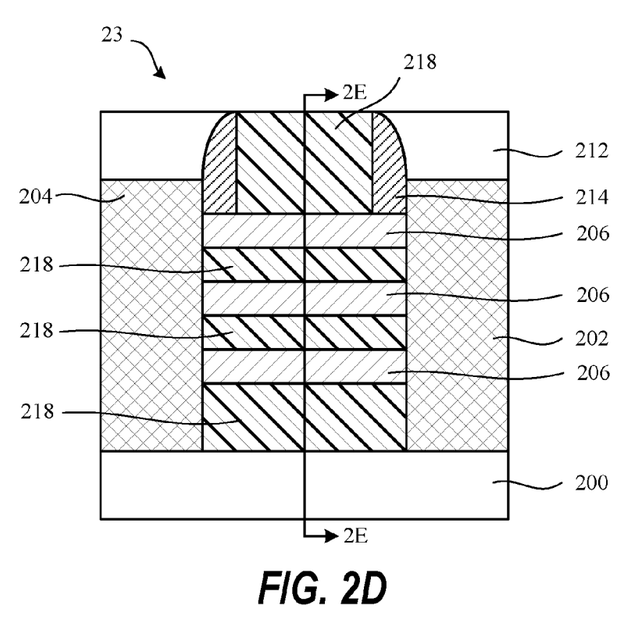
Figure 2E:
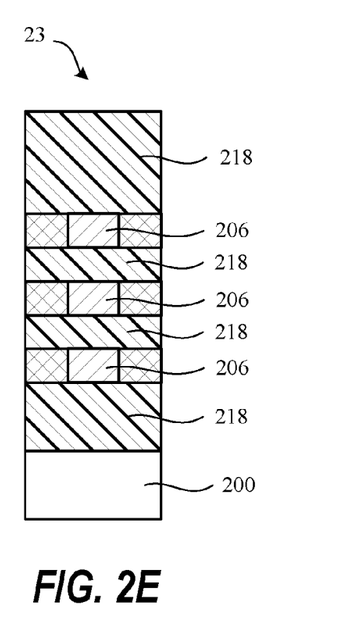

FIG. 2D schematically shows a cross-sectional view of a nanowire transistor 23 following a chemical mechanical polishing (CMP) process. FIG. 2E is a cross-sectional view of the nanowire transistor 23 along line 2E-2E of FIG. 2D.

Figure 2F:
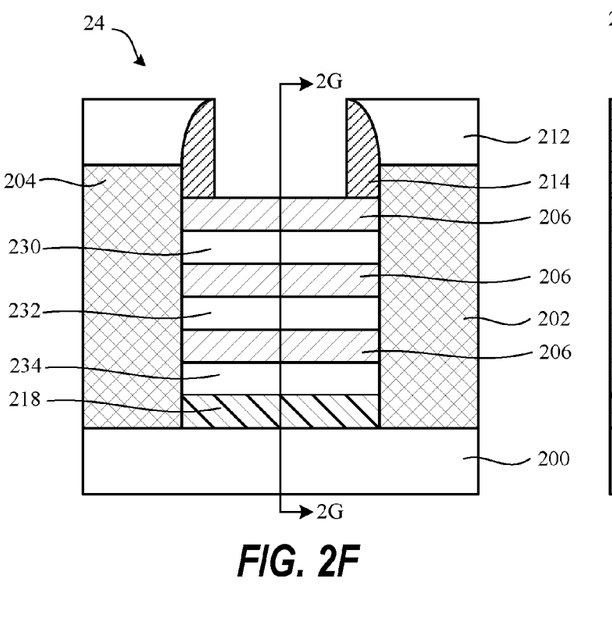
Figure 2G:
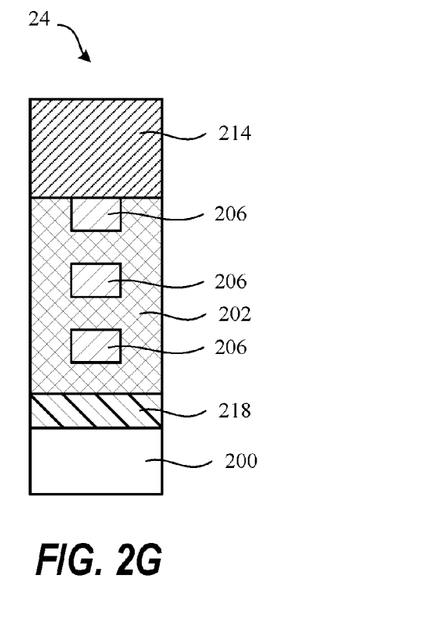

FIG. 2F schematically shows a cross-sectional view of a nanowire transistor 24 following an isotropic etching process that removes most of the first dielectric layer 218 from the nanowire transistor 24. FIG. 2G is a cross-sectional view of the nanowire transistor 23 along line 2G-2G of FIG. 2F. The isotropic etching process removes the first dielectric layer 218 from the second opening 232, while leaving a portion of the first dielectric layer 218 in the first opening 234. The isotropic etching process can be terminated when the first dielectric layer 218 has a desired thickness on the substrate 200 in the first opening 234. In some examples, a thickness of the first dielectric layer 218 in the first opening 234 can be less than about 15 Angstrom, less than 10 Angstrom, or less than 5 Angstrom.

The isotropic etching process can, for example, be a chemical oxide removal (COR) process. In one example, a COR process may be performed in a Certas WING™, a high throughput gas plasma-free chemical etching system available from Tokyo Electron Limited, Akasaka, Japan.

Figure 5:
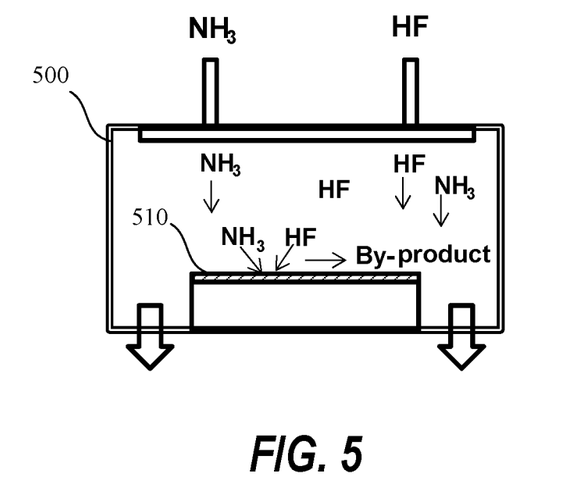
FIGS. 5 and 6 schematically show process chambers capable of performing a chemical oxide removal (COR) process.
Figure 6:
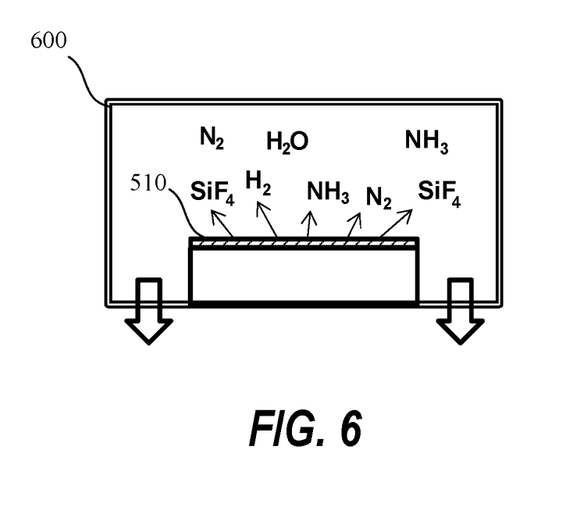

FIGS. 5 and 6 schematically show process chambers capable of performing a COR process. FIG. 5 shows a process chamber 500 configured for exposing a substrate (wafer) 510 containing a $SiO_2$ layer to $NH_3$ and HF gases. The $NH_3$ and HF gas exposures form a layer of reaction byproducts on the substrate 510. In one example, the processing conditions can include a HF gas flow rate of 40 sccm, a $NH_3$ gas flow rate of 40 sccm, a substrate temperature of about 20-80° C., for example about 30° C., and a process chamber pressure of 40 mTorr.

FIG. 6 shows a process chamber 600 configured for heat-treating the substrate 510 to remove the layer of reaction byproducts from the $NH_3$ and HF gas exposures performed by the process chamber in FIG. 5. In one example, the processing conditions can include a substrate temperature of about 100-200° C., and a $N_2$ gas purge.

Figure 2H:
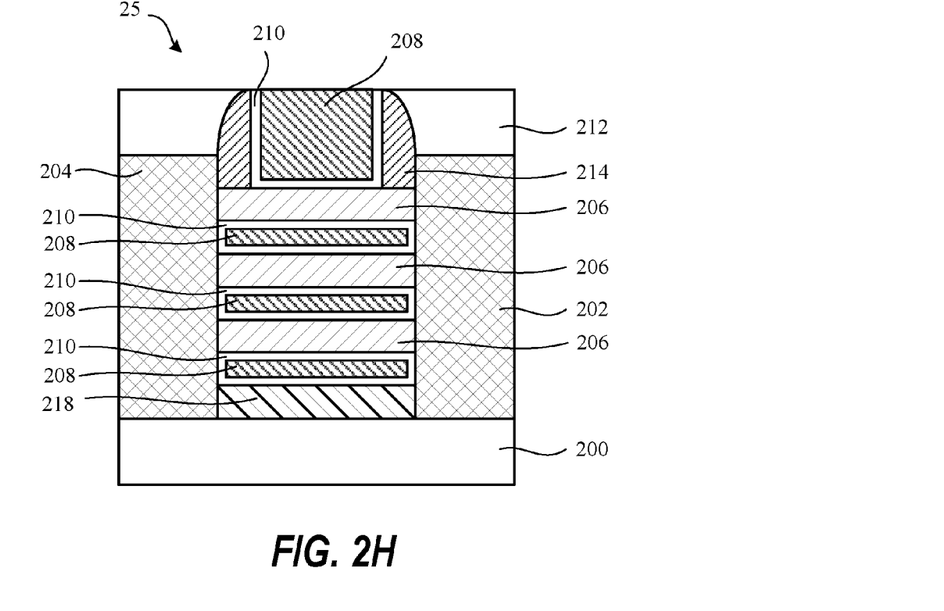

FIG. 2H schematically shows a cross-sectional view of a nanowire transistor 25 following deposition of a second dielectric layer 210 that encapsulates the nanowires 206, and deposition of a metal-containing gate electrode layer 208 that fills the remaining openings in the nanowire transistor 24. In one example, the second dielectric layer 210 includes $HfO_2$, HfSiO, HfON, $ZrO_2$, ZrSiO, ZrON, or a combination thereof. The exemplary nanowire transistor 25 in FIG. 2H has three nanowires 206. The nanowire transistor 25 has lower parasitic capacitance and lower $I_{off}$ than the prior art nanowire transistor 1 in FIG. 1. This is due to the lower dielectric constant of the first dielectric layer 218 compared to the high-k layer 110. In the embodiment shown in FIG. 2H, the second dielectric layer 210, and not the first dielectric layer 218, is formed between the nanowires 206.

FIGS. 3A-3I schematically show through cross-sectional views formation of a nanowire transistor according to an embodiment of the invention. The nanowire transistor 23 in FIGS. 2D and 2E is reproduced as nanowire transistor 30 in FIGS. 3A and 3B.

Figure 3A:
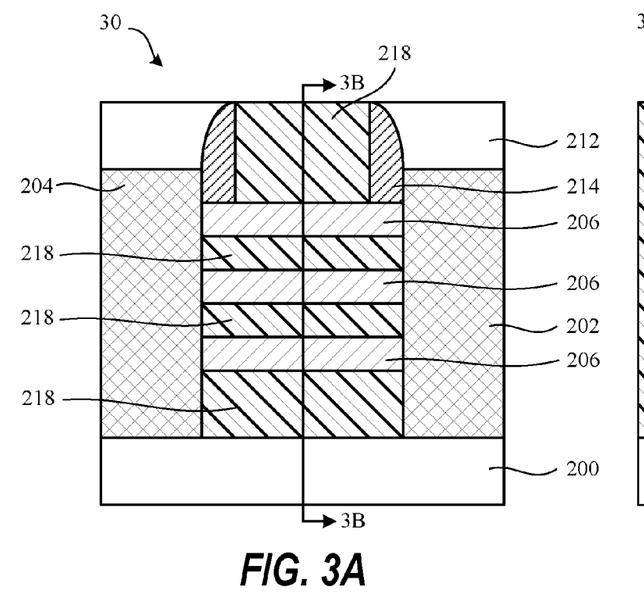
FIGS. 3A-3I schematically show through cross-sectional views formation of a nanowire transistor according to an embodiment of the invention.
Figure 3B:
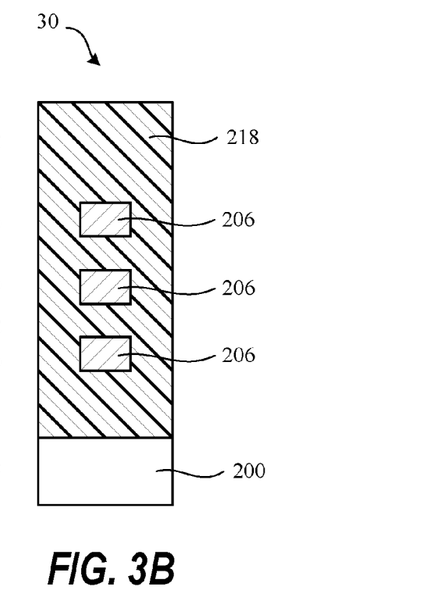
Figure 3C:
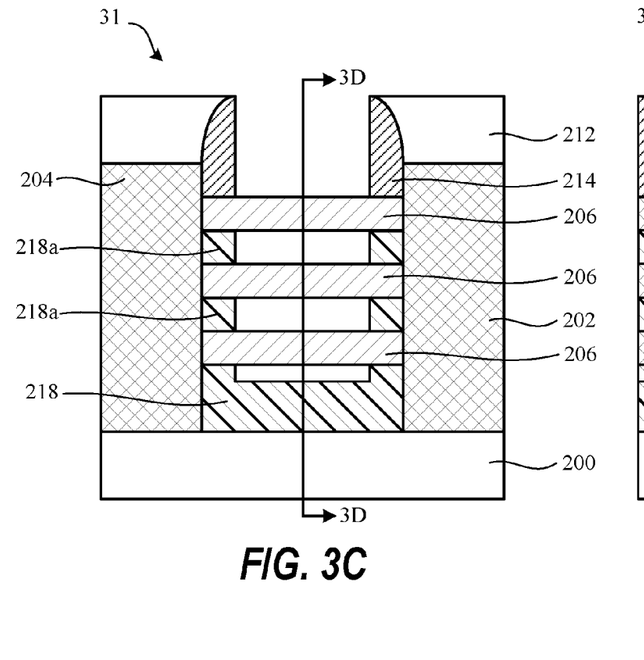
Figure 3D:
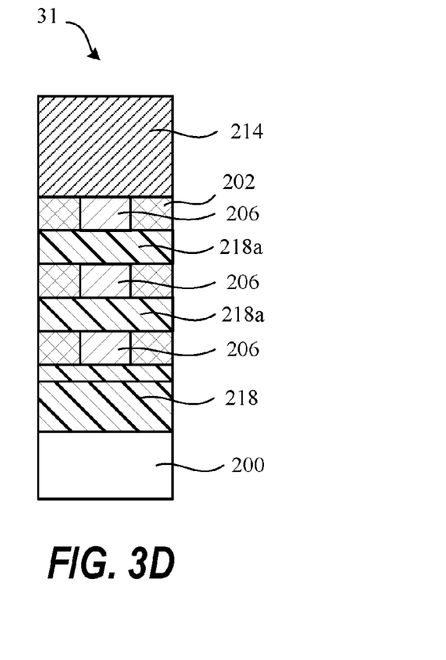

FIG. 3C schematically shows a cross-sectional view of a nanowire transistor 31 following a selective anisotropic etching process that etches the first dielectric layer 218. FIG. 3D is a cross-sectional view of the nanowire transistor 31 along line 3D-3D of FIG. 3C. In one example, the anisotropic etching process can be a reactive ion etching (RIE) process. Following the anisotropic etching process, a portion of the first dielectric layer 218 is present on the substrate 200 and as a first dielectric spacer layer 218a between the nanowires 206 below the sidewall spacer 214. The anisotropic etching process can be terminated when the first dielectric layer 218 has a desired thickness on the substrate 200.

Figure 3E:
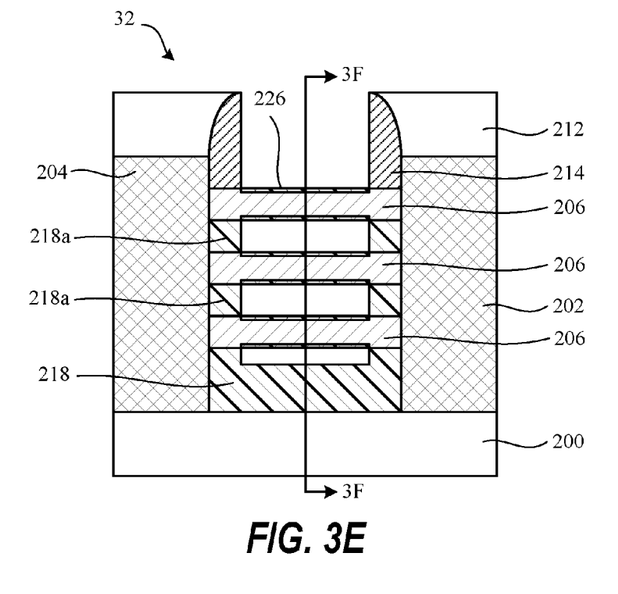
Figure 3F:
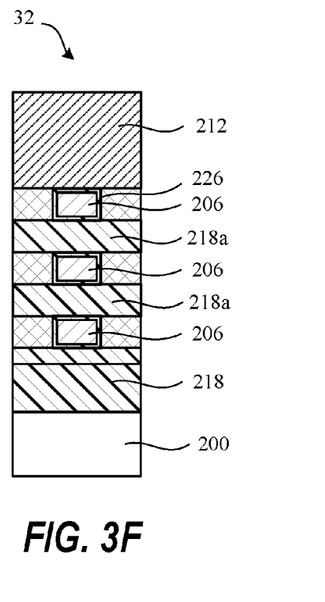

FIG. 3E schematically shows a cross-sectional view of a nanowire transistor 32 following an oxidation process that oxidizes exposed surfaces of the nanowires 206 to form an oxidized layer 226 on the nanowires 206. FIG. 3F is a cross-sectional view of the nanowire transistor 32 along line 3F-3F of FIG. 3E. In some examples, the oxidation process can include thermal or plasma-enhanced oxidation in the presence of an oxygen-containing gas (e.g., $O_2$, $O_3$, or $H_2O$).

Figure 3G:
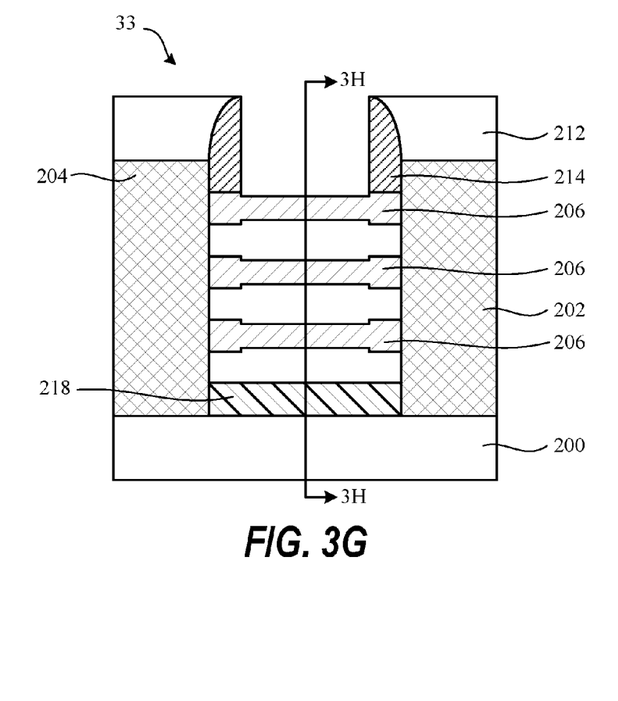
Figure 3H:
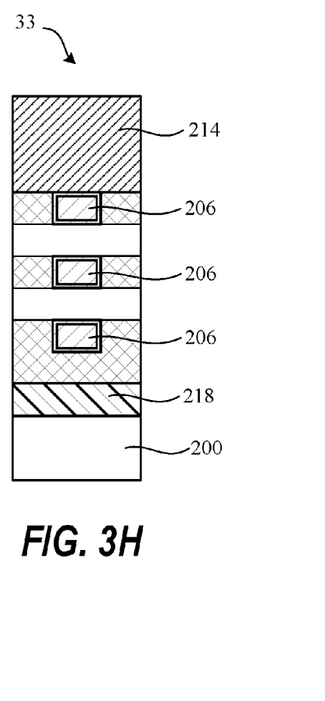

FIG. 3G schematically shows a cross-sectional view of a nanowire transistor 33 following a selective isotropic etching process that removes the oxidized layer 226 and the first dielectric layer 218 between the nanowires 206. FIG. 3H is a cross-sectional view of the nanowire transistor 33 along line 3H-3H of FIG. 3G. A portion of the first dielectric layer 218 on the substrate 200 may also be etched. The oxidation process and the selective isotropic etching process may be carried out in order to remove a damaged surface layer of the nanowires 206 from prior processing steps. The damaged surface layer may, for example, originate from the selective anisotropic etching process of the first dielectric layer 218.

Figure 3I:
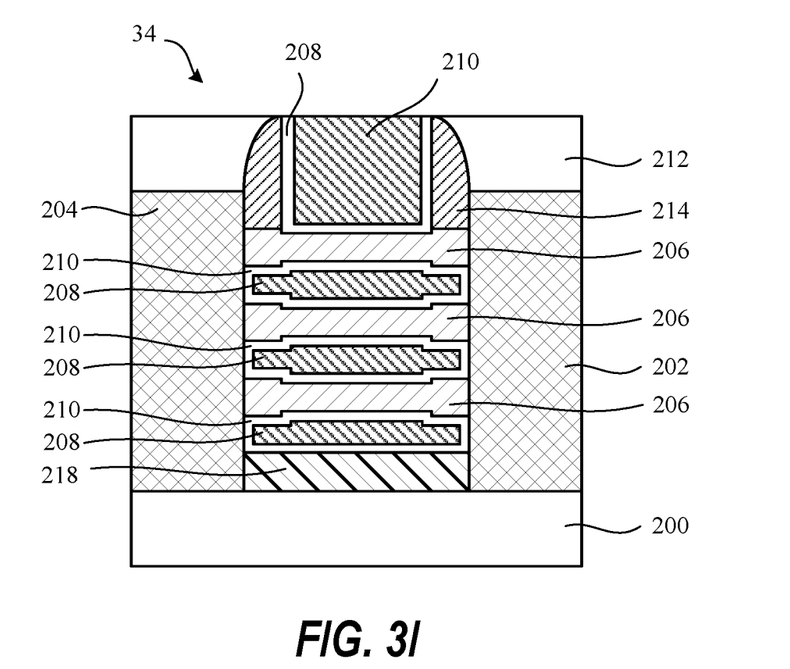

FIG. 3I schematically shows a cross-sectional view of a nanowire transistor 34 following deposition of a second dielectric layer 210 that encapsulates the nanowires 206, and deposition of a metal-containing gate electrode layer 208 that fills the remaining openings in the nanowire transistor 34. The exemplary nanowire transistor 34 in FIG. 3I has three nanowires. The nanowire transistor 34 has lower parasitic capacitance and lower $I_{off}$ than the prior art nanowire transistor 1 in FIG. 1. This is due to the lower dielectric constant of the first dielectric layer 218 compared to the high-k layer 110. In the embodiment shown in FIG. 3I, the second dielectric layer 210, and not the first dielectric layer 218, is formed between the nanowires 206.

FIGS. 4A-4I schematically show through cross-sectional views formation of a nanowire transistor according to an embodiment of the invention. The nanowire transistor 31 in FIGS. 3C and 3D is reproduced as nanowire transistor 40 in FIGS. 4A and 4B.

Figures 4A, 4B:
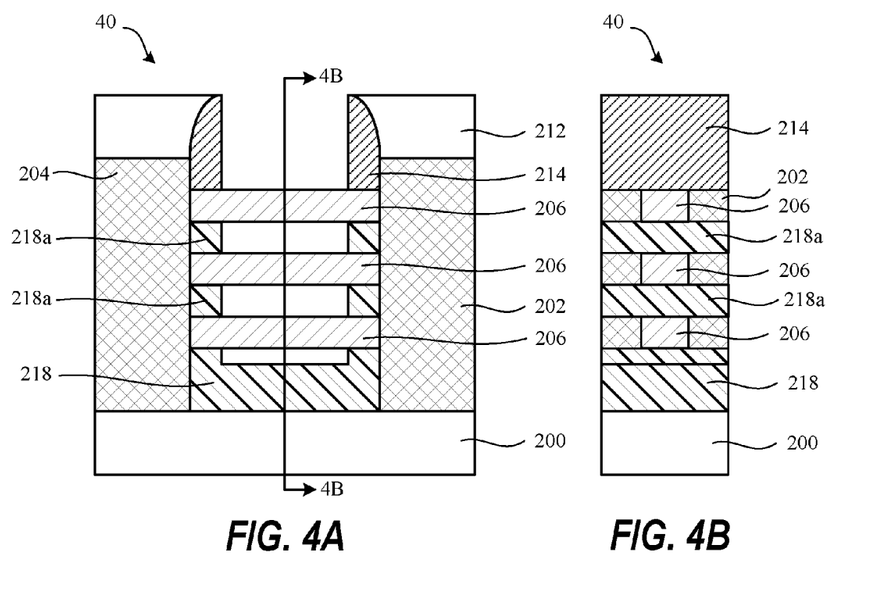
FIGS. 4A-4I schematically show through cross-sectional views formation of a nanowire transistor according to an embodiment of the invention.
Figure 4C:
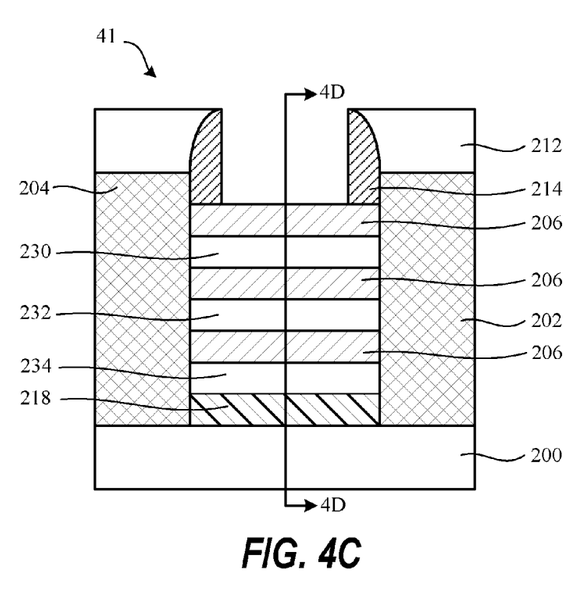
Figure 4D:
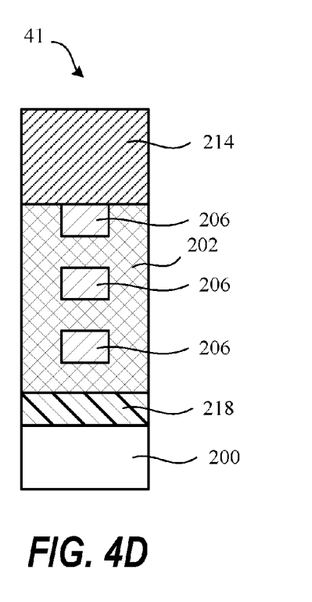

FIG. 4C schematically shows a cross-sectional view of a nanowire transistor 41 following an isotropic etching process that removes most of the first dielectric layer 218 from the nanowire transistor 40, except from the interface of the first dielectric layer 218 with the substrate 200. FIG. 4D is a cross-sectional view of the nanowire transistor 41 along line 4D-4D of FIG. 4C. The isotropic etching process removes the first dielectric film 218 from the openings between the nanowires 206, while leaving the first dielectric film 218 on the substrate 200. The isotropic etching process can be terminated when the first dielectric layer 218 has a desired thickness on the substrate 200.

Figure 4E:
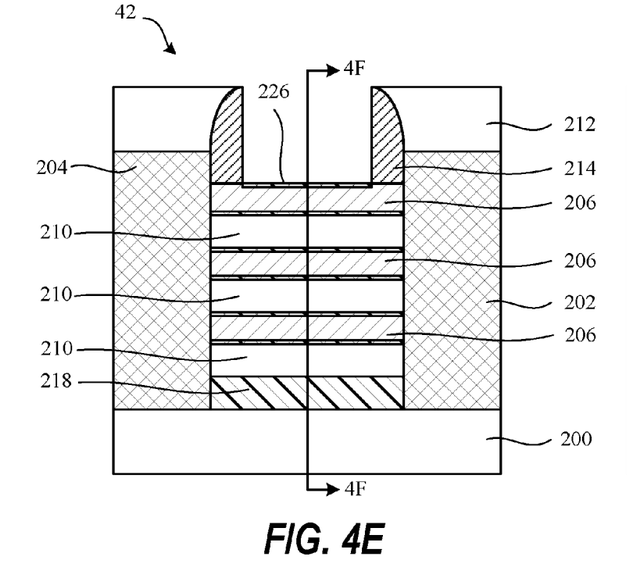
Figure 4F:
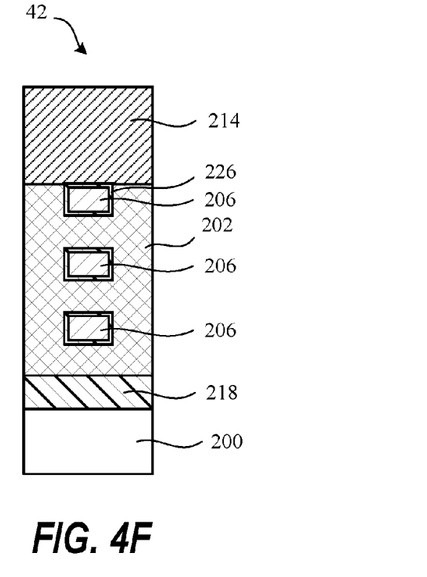

FIG. 4E schematically shows a cross-sectional view of a nanowire transistor 42 following an oxidation process that oxidizes exposed surfaces of the nanowires 206 to form an oxidized layer 226 on the nanowires 206. FIG. 4F is a cross-sectional view of the nanowire transistor 42 along line 4F-4F of FIG. 4E. In some examples, the oxidation process can include thermal or plasma-enhanced oxidation in the presence of an oxygen-containing gas (e.g., $O_2$, $O_3$, or $H_2O$).

Figure 4G:
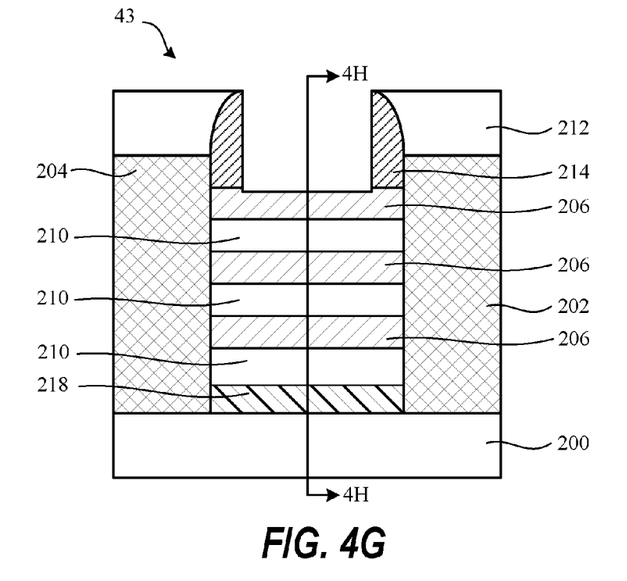
Figure 4H:
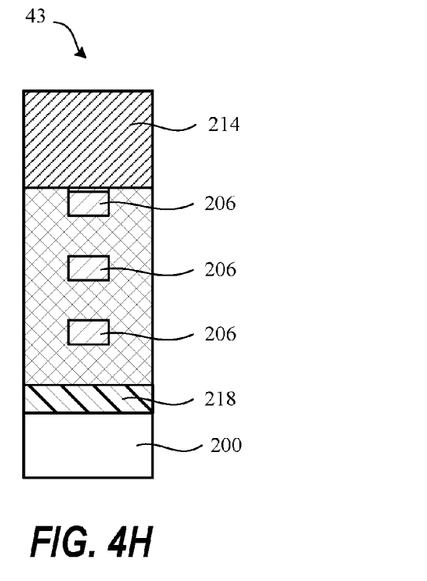

FIG. 4G schematically shows a cross-sectional view of a nanowire transistor 43 following a selective isotropic etching process that removes the oxidized layer 226 from the nanowires 206. FIG. 4H is a cross-sectional view of the nanowire transistor 43 along line 4H-4H of FIG. 4G. A portion of the first dielectric layer 218 on the substrate 200 may also be etched. The oxidation process and the selective isotropic etching process may be carried out in order to remove a damaged surface layer of the nanowires 206 from prior processing steps.

Figure 4I:
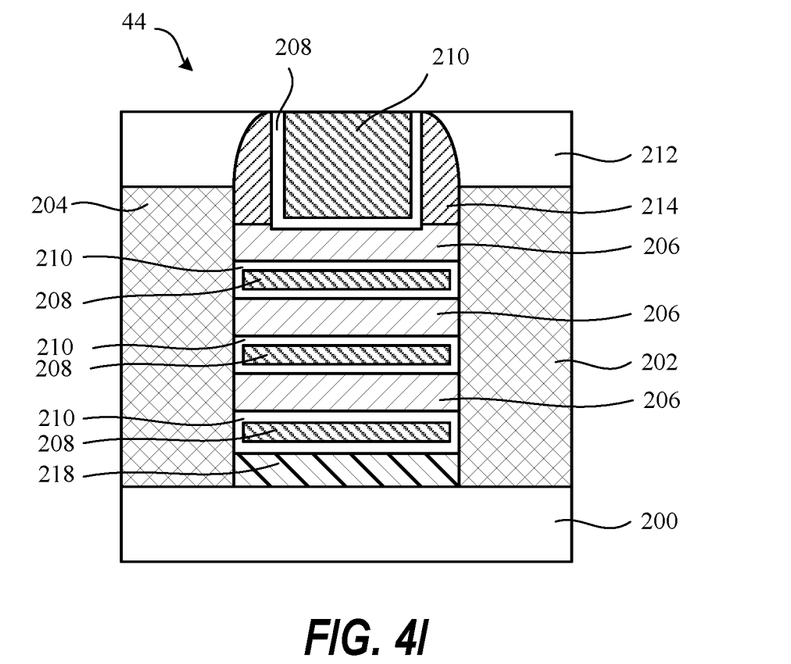

FIG. 4I schematically shows a cross-sectional view of a nanowire transistor 44 following deposition of a second dielectric layer 210 that encapsulates the nanowires 206, and deposition of a metal-containing gate electrode layer 208 that fills the remaining openings in the nanowire transistor 44. The exemplary nanowire transistor 44 in FIG. 4I has three nanowires. The nanowire transistor 44 has lower parasitic capacitance and lower $I_{off}$ than the prior art nanowire transistor 1 in FIG. 1. This is due to the lower dielectric constant of the first dielectric layer 218 compared to the high-k layer 110. In the embodiment shown in FIG. 4I, the second dielectric layer 210, and not the first dielectric layer 218, is formed between the nanowires 206.

A plurality of embodiments for parasitic capacitance reduction for nanowire transistors and method of manufacturing have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of forming a nanowire transistor, the method comprising:
   providing a substrate;
   forming a first nanowire on the substrate;
   forming a second nanowire on the first nanowire;
   thereafter, forming a first dielectric layer between the substrate and the first nanowire; and
   forming a second dielectric layer between the first dielectric layer and the first nanowire, wherein the second dielectric layer has a higher dielectric constant than the first dielectric layer.

2. The method of claim 1, wherein the first and second nanowires consist of Si or SiGe.

3. The method of claim 1, wherein the first dielectric layer includes $SiO_2$, SiON, or SiN, or a combination thereof.

4. The method of claim 1, wherein the first dielectric layer has a dielectric constant of less than 10.

5. The method of claim 1, wherein the second dielectric layer includes $HfO_2$, HfSiO, HfON, $ZrO_2$, ZrSiO, ZrON, or a combination thereof.

6. The method of claim 1, wherein the second dielectric layer, and not the first dielectric layer, is formed between the first nanowire and the second nanowire.

7. The method of claim 1, wherein forming the first nanowire and forming the second nanowire includes creating a fin structure containing epitaxial layers between the substrate and the first nanowire and between the first nanowire and the second nanowire; and
   performing a selective etch process that removes the epitaxial layers, thereby forming a first opening between the substrate and the first nanowire and a second opening between the first nanowire and the second nanowire.

8. The method of claim 7, wherein a height of the first opening between the substrate and the first nanowire is greater than a height of the second opening between the first nanowire and the second nanowire.

9. The method of claim 1, further comprising
   forming a metal-containing gate electrode layer on the second dielectric layer.

10. A method of forming a nanowire transistor, the method comprising:
    providing a substrate;
    forming a first nanowire on the substrate;
    forming a second nanowire on the first nanowire;
    forming a first dielectric layer between the substrate and the first nanowire; and
    forming a second dielectric layer between the first dielectric layer and the first nanowire, wherein the second dielectric layer has a higher dielectric constant than the first dielectric layer;
    wherein forming the first nanowire and forming the second nanowire includes
    creating a fin structure containing epitaxial layers between the substrate and the first nanowire and between the first nanowire and the second nanowire; and
    performing a selective etch process that removes the epitaxial layers, thereby forming a first opening between the substrate and the first nanowire and a second opening between the first nanowire and the second nanowire; and
    wherein forming the first dielectric layer includes
    depositing the first dielectric layer in the first and second openings; and
    performing an etching process that removes the first dielectric layer from the second opening while leaving a portion of the first dielectric layer on the substrate in the first opening.

11. The method of claim 10, further comprising
    oxidizing exposed surfaces of the first and second nanowires to form an oxidized layer on the first and second nanowires; and
    performing an etching process that removes the oxidized layer from the first and second nanowires.

12. The method of claim 10, wherein the first and second nanowires consist of Si or SiGe.

13. The method of claim 10, wherein the first dielectric layer includes $SiO_2$, SiON, or SiN, or a combination thereof.

14. The method of claim 10, wherein the first dielectric layer has a dielectric constant of less than 10.

15. The method of claim 10, wherein the second dielectric layer includes $HfO_2$, HfSiO, HfON, $ZrO_2$, ZrSiO, ZrON, or a combination thereof.

16. A method of forming a nanowire transistor, the method comprising:
    providing a substrate;
    forming a first nanowire on the substrate;
    forming a second nanowire on the first nanowire;
    forming a first dielectric layer between the substrate and the first nanowire; and forming a second dielectric layer between the first dielectric layer and the first nanowire, wherein the second dielectric layer has a higher dielectric constant than the first dielectric layer;

wherein forming the first nanowire and forming the second nanowire includes creating a fin structure containing epitaxial layers between the substrate and the first nanowire and between the first nanowire and the second nanowire; and performing a selective etch process that removes the epitaxial layers, thereby forming a first opening between the substrate and the first nanowire and a second opening between the first nanowire and the second nanowire; and wherein forming the first dielectric layer includes depositing the first dielectric layer in the first and second openings; and performing an anisotropic etching process that removes a portion of the first dielectric layer from the first and second openings as defined by an overlying spacer layer, thereby forming a first dielectric sidewall layer in the first and second openings and forming the first dielectric layer on the substrate.

17. The method of claim 16, further comprising oxidizing exposed surfaces of the first and second nanowires to form an oxidized layer on the first and second nanowires; and performing an etching process that removes the oxidized layer from the first and second nanowires, and removes the first dielectric sidewall layer from the first and second openings.

18. The method of claim 16, wherein the first and second nanowires consist of Si or SiGe.

19. The method of claim 16, wherein the first dielectric layer includes $SiO_2$, SiON, or SiN, or a combination thereof.

20. The method of claim 16, wherein the second dielectric layer includes $HfO_2$, HfSiO, HfON, $ZrO_2$, ZrSiO, ZrON, or a combination thereof.

* * * * *